US008698400B2

(12) United States Patent
Scherer et al.

(10) Patent No.: US 8,698,400 B2
(45) Date of Patent: Apr. 15, 2014

(54) METHOD FOR PRODUCING A PLASMA BEAM AND PLASMA SOURCE

(75) Inventors: Michael Scherer, Kahl (DE); Jurgen Pistner, Alzenau-Michelbach (DE)

(73) Assignee: Leybold Optics GmbH (DE)

( * ) Notice: Subject to any disclaimer, the term of this patent is extended or adjusted under 35 U.S.C. 154(b) by 509 days.

(21) Appl. No.: 12/765,252

(22) Filed: Apr. 22, 2010

(65) Prior Publication Data

US 2011/0068691 A1   Mar. 24, 2011

Related U.S. Application Data

(60) Provisional application No. 61/173,339, filed on Apr. 28, 2009.

(51) Int. Cl.
*H05B 31/26* (2006.01)
(52) U.S. Cl.
USPC ............. 315/111.41; 315/111.31; 315/111.21
(58) Field of Classification Search
USPC ....................................... 315/111.01–111.91
See application file for complete search history.

(56) References Cited

U.S. PATENT DOCUMENTS

| | | | |
|---|---|---|---|
| 3,878,085 A | | 4/1975 | Corbani |
| 4,166,018 A | | 8/1979 | Chapin |
| 4,582,721 A | * | 4/1986 | Yoshino et al. ................. 438/96 |
| 5,113,790 A | * | 5/1992 | Geisler et al. ............. 118/723 E |
| 5,156,703 A | | 10/1992 | Oechsner |
| 5,411,624 A | * | 5/1995 | Hirano et al. ............ 156/345.46 |
| 6,077,403 A | * | 6/2000 | Kobayashi et al. ...... 204/192.12 |
| 6,351,075 B1 | * | 2/2002 | Barankova et al. ...... 315/111.71 |
| 6,787,010 B2 | * | 9/2004 | Cuomo et al. ........... 204/298.07 |
| 6,879,109 B2 | * | 4/2005 | Benveniste et al. ...... 315/111.21 |
| 7,411,352 B2 | * | 8/2008 | Madocks ................. 315/111.21 |
| 7,932,678 B2 | * | 4/2011 | Madocks ................. 315/111.21 |
| 8,125,155 B2 | * | 2/2012 | Chistyakov ............. 315/111.21 |
| 2006/0099341 A1 | * | 5/2006 | Beckmann ................. 427/248.1 |
| 2008/0060933 A1 | * | 3/2008 | Fayet et al. ............. 204/192.12 |

FOREIGN PATENT DOCUMENTS

| | | |
|---|---|---|
| DE | 1024788 | 2/1958 |
| DE | 4109619 C1 | 8/1992 |
| DE | 69421033 T2 | 5/2000 |
| DE | 10008482 A1 | 9/2001 |

(Continued)

OTHER PUBLICATIONS

International Report on Patentability; International Application No. PCT/EP2010/002562; Mail Date Nov. 3, 2011.

(Continued)

*Primary Examiner* — Douglas W Owens
*Assistant Examiner* — Jianzi Chen
(74) *Attorney, Agent, or Firm* — Cantor Colburn LLP (57) ABSTRACT

A plasma source generates a plasma beam that is extracted from a plasma generated by electric and magnetic fields. An RF electrode device includes an excitation electrode having an excitation area, and a plasma space is arranged between extraction electrode and excitation area. The plasma, relative to the extraction electrode is at a higher potential which accelerates positive plasma ions, and the plasma and the extracted plasma beam are influenced by a magnetic field. At least one magnet north pole and one magnetic south pole generate the magnetic field. Each are arranged such that a curved magnetic field projecting into the interior of the plasma space is formed. At least one of the north or south poles is embodied in elongate fashion to form a tunnel-like region in the plasma, in which charged particles are held and along which the latter can propagate.

16 Claims, 4 Drawing Sheets

(56) References Cited

FOREIGN PATENT DOCUMENTS

| | | |
|---|---|---|
| DE | 10317027 A1 | 11/2004 |
| DE | 102004043967 A1 | 3/2006 |
| DE | 102007051444 A1 | 4/2009 |
| EP | 0349556 B1 | 1/1990 |
| EP | 1614138 B1 | 1/2006 |
| JP | 02502593 A | 8/1990 |
| JP | 488165 A | 3/1992 |
| JP | 6330303 A | 11/1994 |
| JP | 2771205 B2 | 4/1998 |
| JP | 11162367 A | 6/1999 |
| JP | 11172431 A | 6/1999 |
| WO | 2004050944 A2 | 6/2004 |
| WO | 2004091264 A2 | 10/2004 |
| WO | 2005008717 A2 | 1/2005 |

OTHER PUBLICATIONS

Japanese Office Action for corresponding Japanese Application No. 2012-507631, dated Dec. 2, 2013, pp. 1-6.

Korean Office Action for corresponding Korean Application No. 10-2011-7028210, dated Dec. 30, 2013, pp. 1-9.

* cited by examiner

METHOD FOR PRODUCING A PLASMA BEAM AND PLASMA SOURCE

TECHNICAL FIELD

The invention relates to a method for generating a plasma beam and to a plasma source for carrying out the method in each case according to the features of the preambles of the independent patent claims.

BACKGROUND

Plasma sources excited by radiofrequency (RF) in a frequency range of between 1 MHz and 20 MHz and comprising a plasma space which is closed off by a grid and from which a plasma beam is extracted are known, wherein a distinction is made between inductive and capacitive excitation of the plasma to which a magnetic field is usually applied. In the case of such radiofrequency plasma sources having inductive and mixed inductive/capacitive excitations, modified Helmholtz coils are used which generate substantially homogeneous fields that are perpendicular to an induction RF coupling-in coil or turn and lead to an increase in the plasma density.

DE 694 210 33 T2 discloses, for example, an inductive plasma source which is operated in the radiofrequency range (RF) and in which, with a reduced number of system components, the plasma density is increased by permanent magnets arranged outside a vacuum chamber.

DE 100 084 82 A1 discloses an RF plasma source comprising a magnetic field coil arrangement and a unit for extracting a plasma beam, wherein a transverse magnetic field is superposed on an excitation electrode and, for generating a transverse magnetic field, magnetic field coils are arranged around a plasma volume. In that case it is possible to choose between capacitive and inductive plasma excitation, wherein the ion energy can be set in a range of from 10 eV to approximately 1000 eV.

A capacitively coupled plasma source is known from EP 0349556 B1, according to which it is possible to extract a plasma beam for example for the removal and structuring of solid surfaces for the production of surface dopings by particle bombardment or for the production of surface layers. This known plasma source comprises a plasma vessel, which surrounds a plasma space, and also two large-area electrodes, which are connected to a radiofrequency generator via a matching network. The areas of the electrodes are chosen such that virtually the entire radiofrequency voltage is dropped across the extraction electrode. The extraction electrode is arranged in an opening in the pot-shaped plasma vessel. A radiofrequency voltage is applied to the other electrode, which serves as a coupling electrode, wherein the extraction electrode acquires ground potential. In the plasma space, plasma is ignited when the radiofrequency voltage is applied to the excitation electrode and a process gas is fed in the plasma space. The plasma automatically acquires a higher, positive potential relative to the extraction electrode, wherein ions of the plasma are accelerated toward the extraction electrode in contact with the plasma and pass through the extraction electrode. The ion current extracted by the extraction electrode is superposed by an electrode current of identical magnitude that flows with the radiofrequency timing, such that, on average over time, an electrically neutral plasma beam is extracted from the plasma source. RF plasma sources of this type are usually used for ion energies at between 50 eV and 100 eV and in an operating pressure range of between $10^{-4}$ mbar and $10^{-2}$ mbar. In order to improve the properties of the plasma source, the cited document proposes superposing suitably shaped axial constant magnetic fields on the plasma vessel by means of the plasma vessel being surrounded externally by the use of magnetic field coils in which the plasma vessel is arranged concentrically. In that case, in the regions in which the magnetic field lines run parallel to the walls of the plasma vessel, the diffusion motion of plasma particles to the walls can be restricted, whereby wall losses are greatly reduced and the plasma density can be increased. This in turn serves to increase the ion and electron current density in the extracted plasma beam. Usually, two solenoid coils are arranged around the plasma vessel wherein a particularly effective electron confinement and hence a high plasma density are achieved if currents in opposite directions, that is to say mutually repelling magnetic fields, are generated in the plasma vessel.

WO 2005/008717 discloses a capacitively excited RF plasma source for generating a plasma beam shaped by magnetic fields, wherein an increase in the plasma density and hence operation of the source at relatively low plasma pressures are made possible by means of a homogeneous magnetic field, wherein a set of coils or permanent magnets are provided for generating the magnetic field.

The known inductively and/or capacitively excited RF plasma sources constitute cost-intensive solutions, require a large amount of space owing to the use of the magnetic field coils mentioned and have a complicated construction, such that size scaling for the plasma treatment of large-area substrates, for example as rectangular sources for use in architectural glass coating installations or drum installations, is not very suitable.

For the coating and for the etching of surfaces which can be brought very close to a plasma space, gridless RF plasma sources with a plasma to which magnetic fields are applied are also known. Thus, DE 41 096 19 C1, for example, discloses an RF plasma source comprising two electrodes, of which the first electrode is embodied as a hollow electrode and the second electrode, which is to carry a substrate, is disposed upstream of the cavity of the first electrode. The hollow electrode is surrounded by a dark space shielding and has edges which face in the direction of the second electrode and between which are provided projections that are at the same electrical potential as the first electrode. Between the projections, permanent magnets are provided, by means of which a substrate bias voltage can be set independently of the discharge geometry, the discharge pressure and the radiofrequency power.

DE 102 478 8 A1 furthermore discloses a device for generating plasmas by means of radiofrequency discharges, comprising at least two electrodes, between which a plasma discharge can be maintained, wherein one electrode is embodied as a hollow electrode, a grounded area forms a counterelectrode and that side of the hollow electrode which faces away from the plasma discharge is enclosed by a shielding electrode. A substrate to be coated is arranged between counterelectrode and hollow electrode, such that the substrate itself forms the termination of a space filled with a dense plasma, and provides for a high effectiveness of the plasma treatment. On the outer side of the hollow electrode, in the interspace between hollow electrode and shielding electrode, permanent magnets are fitted, which provide for a magnetic field that leads to an increase in the plasma density in the interior of the hollow electrode.

What is disadvantageous about the gridless sources mentioned is that the area to which the plasma is to be applied has to be brought extremely close to the plasma space and in the process has to serve as a temporary wall of the plasma vessel.

Magnetic fields are also used in magnetron sputtering in order to increase the plasma density and to increase the sputtering rate of a material sputtered from a target, with the same operating pressure. Thus, DE 24 318 32 A discloses a cathode sputtering apparatus (magnetron sputtering apparatus) wherein the magnetic force lines that emerge from an active surface of a cathode and re-enter it run between the emergence and re-entry locations and a tunnel-like region is afforded, in which charged particles are held and in which they can move. In that case, the front side of the cathode, which faces the plasma, can be planar or have a concave or convex curvature. Furthermore, the cathode can have a circular or rectangular form. DE 24 172 88 C2 furthermore discloses a cathode sputtering apparatus wherein a magnet device is arranged in such a way that magnetic field lines emerging from a sputtering area and returning thereto form a discharge region having the form of a self-contained loop, wherein the cathode surface which is to be sputtered and faces the substrate to be coated is planar, the substrate can be moved close to the discharge region parallel to the planar sputtering area across the latter and the magnetic field-generating magnet device is arranged on that side of the cathode which faces away from the planar sputtering area.

In the case of the known cathode sputtering apparatuses, the cathode and an anode assigned thereto are connected in such a way that the cathode acquires a potential below the potential of the anode.

BRIEF SUMMARY

The invention is directed toward generating a plasma beam in a simple and effective manner.

In the method according to the invention for generating a plasma beam which is extracted from a plasma generated by electric and magnetic fields by means of a radiofrequency voltage being applied to an extraction electrode and an RF electrode device having an excitation electrode having an excitation area, wherein a plasma space is arranged between extraction electrode and excitation area and the plasma, relative to the extraction electrode, on average over time, is at a higher potential which accelerates positive plasma ions, and the plasma and the extracted plasma beam are influenced by a magnetic field, it is provided that at least one magnetic north pole and one magnetic south pole are used for generating the magnetic field, which in each case are arranged on a side facing away from the plasma behind the excitation electrode and are directed into the interior of the plasma space, such that a curved magnetic field projecting into the interior of the plasma space is formed, and wherein at least one of the north or south poles is embodied in elongate fashion, such that a tunnel-like region is formed in the plasma, in which charged particles are held and along which the latter can propagate.

In order to generate the plasma, a process and/or reactive gas, preferably argon and/or oxygen, is conducted into the plasma space and ignited with the aid of a pressure surge, if appropriate.

The Schottky-Langmuir space charge layer forms between the generated plasma and the extraction electrode, the thickness d of said layer being dependent on the current density j and the electrical voltage drop U between the plasma edge and the extraction electrode:

$$d = \sqrt{\frac{4\varepsilon_0}{9 \cdot j}} \cdot \sqrt[4]{\frac{2 \cdot e}{m_{ion}}} \cdot U^{\frac{3}{4}}$$

where
$\varepsilon_0$: permittivity of free space
e: elementary charge
$m_{ion}$: mass of the ions involved.

In the method according to the invention, positive plasma ions and electrons are accelerated, leave the plasma space through the extraction grid and enter as an extracted plasma beam, which is neutral on average over time, into the interior of a vacuum chamber in order to impinge on a substrate, wherein the plasma and the extracted plasma beam are influenced by a magnetic field. It is preferably provided that the extraction electrode acquires ground potential. As is illustrated in EP 0349556 B1, the disclosure content of which is fully incorporated by reference in the disclosure content of the present documents, the plasma, relative to the extraction electrode, in this case automatically acquires the higher potential which accelerates positive plasma ions since a relatively high DC self-bias forms if the ratio of the size of the area covered by the extraction electrode is sufficiently small relative to the size of the excitation area. The DC self-bias, which is also influenced by the magnetic field, reflects the relative ratio of the average voltages dropped across the plasma edge layer before the respective electrode.

In a further embodiment of the invention, the extraction electrode can be connected to an external voltage source and in this way can be put at a potential that is different than the ground potential, wherein generally an ion beam rather than a neutral plasma beam is generated. If appropriate, charging of a substrate to which the ion beam is applied, can be prevented using means that are known per se.

If, according to the invention, a magnetic north pole and a magnetic south pole are used for generating the magnetic field, which in each case are arranged on a side facing away from the plasma behind the excitation electrode and are directed into the interior of the plasma space, such that a curved magnetic field projecting into the interior of the plasma space is formed, a tunnel-like region can form in the plasma, in which charged particles can be held and along which the latter can propagate, wherein at least one of the north or south poles is embodied in elongate fashion. A magnetic field generated in this way advantageously leads to a small free path length of the electrons in the plasma even at a low operating pressure of down to 5 to $8 \times 10^{-4}$ mbar, depending on the magnetic field strength in each case, and is already known per se in the context of magnetron sputtering, but has not been used for RF plasma sources of the generic type. Magnetic fields at the surface of the excitation area having values of between 10 mT and 1500 mT are preferred, although higher field strengths are also conceivable.

In contrast to the application of such magnetic fields which is known from magnetron sputtering, the excitation electrode is not sputtered or is only slightly sputtered in the method according to the invention since the positive plasma ions are accelerated by electric fields in the direction of and toward the extraction electrode and not the excitation electrode or the surface thereof.

The plasma source according to the invention for carrying out the method according to the invention comprising a plasma vessel, comprising an extraction electrode and comprising an RF electrode device having an excitation electrode having an excitation area, which can be connected or is connected to an RF generator via a matching network, wherein a plasma space in which a plasma can be excited is situated between excitation area and extraction electrode, and wherein the size of the area of the extraction electrode and the size of the excitation area are chosen in such a way that virtually the entire radiofrequency voltage is dropped across the extraction electrode, and comprising a magnet apparatus for generating a magnetic field, is distinguished by the fact that the magnet apparatus has at least one magnetic north pole and one magnetic south pole, which in each case are arranged on a side facing away from the plasma space behind the excitation electrode and are directed into the interior of the plasma space, such that a curved magnetic field projecting into the interior of the plasma space can be formed, wherein at least one of the north or south poles is embodied in elongate fashion, such that a tunnel-like region can be formed, in which charged particles can be held and along which they can propagate.

A plasma source of the generic type is already known from EP 0349556 B1, to which reference has already been made. In contrast to the known plasma source, according to the invention it is provided that the magnet apparatus has at least one magnetic north pole and one magnetic south pole, which in each case are arranged on a side facing away from the plasma space behind the excitation electrode and are directed into the interior of the plasma space, such that a curved magnetic field projecting into the interior of the plasma space can be formed, wherein at least one of the north or south poles is embodied in elongate fashion, such that a tunnel-like region can be formed, in which charged particles can be held and along which they can propagate.

Analogously to the method according to the invention, in the plasma source according to the invention, by virtue of such a magnet apparatus, a particularly effective electron confinement and hence a high plasma density with a very high plasma current density are realized.

If the tunnel-like region in which charged particles are held and along which they can propagate is self-contained, the electron confinement and the plasma density are increased further.

The RF electrode device preferably comprises an electrode carrier, to which the excitation electrode is fixed. The electrode carrier can have a plate-like element having a front side and a rear side, wherein the excitation electrode is fitted to the front side of the element. The magnet apparatus can be arranged on the rear side of the element of the electrode carrier.

In one embodiment of the invention, the excitation area can be embodied in concave fashion with respect to the plasma space at least in partial regions. Furthermore, the excitation area can be embodied in convex fashion with respect to the plasma space at least in partial regions. The terminology used here for convex/concave is as follows: if an area in a vicinity of a point lies on the same side of the tangential plane as the observer, then it is curved concavely relative to the observer; if an area lies on the other side of the tangential plane with respect to the observer, then it is curved convexly there.

In a further particularly simple embodiment, at least one part of the excitation area is embodied in planar fashion. Furthermore, the excitation area can be embodied in tunnel-like fashion or in partial-cylinder-like fashion with an opening angle toward the extraction grid, in which case it goes without saying that the magnet apparatus and, if appropriate, an electrode mount are adapted to this geometry.

It is particularly preferred if the magnet apparatus is embodied as in the case of a planar magnetron, as is described for example in DE 2417288 C2 or in DE 2431832 B2. In particular the magnet apparatus can be embodied as a circular or rectangular magnetron. In the case where the magnet apparatus is embodied as a rectangular magnetron, one particular advantage consists in the simple size upscaling, wherein the area to which the plasma beam is to be applied can be enlarged, for example for continuous installations such as architectural glass coating installations.

Particularly if the magnetron apparatus is configured as a circular or rectangular magnetron, as mentioned above, it is advantageously possible to incorporate commercially available RF electrodes or excitation electrodes as components of the magnet apparatus in the plasma source according to the invention and thus to find cost-effective solutions. Preferably, the excitation area is formed by the sputtering target of such magnetrons or can be formed by the latter, in which case it goes without saying that, according to the invention, the plasma source is operated in such a way that material of the excitation area is not sputtered or is only slightly sputtered.

The plasma vessel preferably has a front side, which is oriented in the incorporated state into the interior of a vacuum chamber, and a rear side, between which the plasma space is situated. The rear side is preferably arranged in the outer region of the vacuum chamber.

In one preferred embodiment, the plasma vessel is arranged in an opening in a vacuum chamber wall, wherein the extraction grid is oriented into the interior of the vacuum chamber. The extraction electrode is preferably embodied as a single grid, perforated sheet or screen. It goes without saying, however, that multiple grids are also concomitantly encompassed by the invention. The extraction electrode can be embodied as a fine grid or the like, the openings of which are smaller or larger than the thickness of the space charge layer between the extraction electrode and the plasma. If the openings are larger than the thickness of the space charge layer between the extraction electrode and the plasma, as is illustrated in EP 1614138 A2, a divergent plasma beam can be generated. The disclosure content of EP 1614138 A2 is fully incorporated by reference in the disclosure content of the present documents.

The plasma vessel can also be placed onto the vacuum chamber wall, such that at least one part of the plasma vessel projects into the outer region of the vacuum chamber.

In a further embodiment, the excitation electrode is assigned a dark space shielding composed of a conductive material having a shielding area in order to prevent the formation of parasitic plasmas at the excitation electrode. In this case, an interspace is situated between the shielding area and surfaces of the excitation electrode, said interspace being dimensioned such that an ignition of undesired discharges between the excitation electrode and the dark space shielding is avoided during operation of the plasma source. The distance between the shielding area of the dark space shielding and the corresponding surface of the excitation electrode is therefore smaller than the dark space distance and is in a range of between 1 mm and 10 mm, preferably between 1 mm and 5 mm. The dark space shielding is preferably at ground potential.

A part of a wall of the plasma vessel can be embodied as dark space shielding. Furthermore, parts of the wall of the plasma vessel can be formed by parts of a wall of the excitation electrode.

Furthermore, a plasma electrode can be provided, which acquires the same electrical potential as the extraction electrode and which has a plasma electrode surface that is in contact with the plasma during operation of the plasma source. Preferably, the plasma electrode is electrically conductively connected to the dark space shielding.

The size of the plasma electrode surface in contact with the plasma influences the DC self-bias and is chosen according to the invention together with the size of the area of the extraction electrode relative to the size of the excitation area of the excitation electrode in such a way that the plasma, relative to the extraction electrode and the plasma electrode, on average over time, acquires a higher potential which accelerates positive plasma ions.

In a further embodiment of the invention, the excitation electrode has a wall having an inner side and an outer side, wherein partial regions of the excitation area are arranged on the inner side of the wall or form the latter, and wherein at least partial regions of the outer side are surrounded by the shielding area of the dark space shielding.

In a further structurally simple embodiment of the invention, the excitation electrode is embodied as a hollow electrode or in pot-like fashion and has a base region and side walls, wherein at least the side walls project into the plasma space of the plasma vessel. In this case, it is preferably provided that the dark space shielding surrounds the excitation electrode in such a way that the shielding area is arranged in the region of the side area. In this case, it is preferred for the dark space shielding to be embodied as part of the wall of the plasma vessel and for the plasma electrode to be embodied as part of the dark space shielding, wherein the base region of the excitation electrode furthermore forms a part of the wall of the plasma vessel.

The plasma vessel can be formed from a conductive material and/or from an insulator material.

Aluminum or metals such as titanium, tantalum or zirconium are preferably used as material of the extraction electrode and/or of the plasma electrode. Aluminum has the advantage of a low sputtering yield, that is to say low sputtering by the plasma beam during operation of the plasma source with oxygen, but requires complicated cooling at higher radiofrequency powers in the case as an extraction electrode. Titanium, tantalum and zirconium are preferred in applications of the plasma source in the production of optical layers since no cooling is necessary and since material which consists of them and is sputtered during operation of the plasma source, upon incorporation into optical layers, results in only a relatively small increase in the optical absorption, in which case this holds true for zirconium right into the UV range of light.

The excitation electrode and also the excitation area can be formed from metals having good thermal conductivity such as aluminum, copper or the like. What is particularly advantageous is a water-cooled embodiment of the excitation electrode with an at least partly bonded excitation area in order that the thermal loading of the plasma source and/or of the substrates is kept low.

Furthermore, the excitation area, the extraction electrode, the plasma electrode and/or the dark space shielding can have a partial coating composed of an insulator material such as quartz.

A device for altering the magnetic field is advantageously provided, which can be used to alter the position of at least one of the magnetic north or south poles relative to the excitation area and hence the plasma density and therefore ion energy and ion current of the plasma. The device can be operated manually or by means of a motor. By way of example, a distance, in particular an air gap between at least one of the magnetic Poles and the excitation area can be alterable or altered. Preferably, in order to cover a wide ion energy range, the magnetic field strength can be reduced from a value of 150 mT to a value of 10 mT.

The ion energy and ion current of the plasma beam generated by the method according to the invention and the corresponding plasma source are variable within wide limits by means of changing the operating pressure of the process gas, the supplied RF power and also the magnetic field strength.

The plasma source according to the invention can advantageously be operated at an operating pressure of a process gas of between $10^{-4}$ and $10^{-2}$ mbar and supplies a plasma beam having an ion energy range of between 50 and 1000 eV.

The method according to the invention and also the plasma source can advantageously be used for plasma-enhanced reactive magnetron sputtering, as is known from WO 2004/050944 A2, for example. Further preferred applications of the plasma source concern improving the layer quality in the case of coatings at different angles of incidence, such as, for example, in the case of three-dimensional parts by means of high-energy ion bombardment (preferably with energies in a range of between 100 eV and 800 eV), in order to produce smooth, compact layers exhibiting a low degree of scattering, for the precleaning of substrates by means of sputtering etching or during plasma-enhanced sputtering.

BRIEF DESCRIPTION OF THE DRAWINGS

Further aspects and advantages of the invention will also become apparent, independently of their combination in the patent claims, from the following exemplary embodiments explained in greater detail with reference to figures.

In the figures, in schematically simplified fashion,

FIG. 1c having a circular excitation electrode of an apparatus according to the invention according to FIG. 1a;

DETAILED DESCRIPTION

Figure 1A:
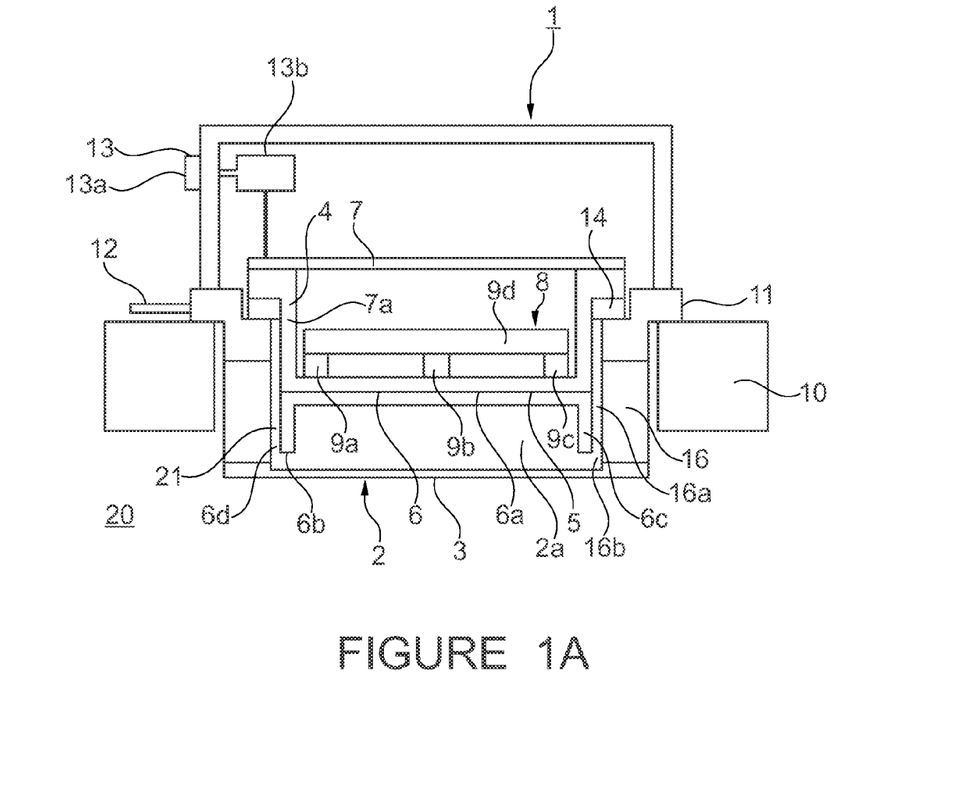
FIG. 1a shows a cross-sectional illustration of an RF plasma source according to the invention.

FIG. 1a shows, in a schematic illustration, a cross section of an RF plasma source 1 according to the invention incorporated into a vacuum chamber 10 and comprising a plasma vessel 2, an extraction electrode 3 and an RF electrode device 4. Process and reactive gases such as argon and oxygen can be introduced into the plasma vessel 2 via a gas feed device 12.

The plasma vessel 2 has a front side and a rear side, between which the plasma space 2a is situated. The plasma vessel 2 furthermore has side walls 16, which project into the interior 20 of the vacuum chamber 10 and to the end sides of which is fitted the extraction electrode 3, which forms the front side of the plasma vessel 2 and which thus delimits the plasma space 2a with respect to the interior 20 of the vacuum chamber in a permeable manner. The extraction electrode 3 can also be embodied in curved fashion.

The plasma vessel 2 can have a rectangular or round form in a perpendicular plane with respect to the plane of the drawing in FIG. 1a. The base area of the excitation electrode 6, which base area is planar in FIG. 1a, can also be embodied in concave or convex fashion relative to the extraction electrode. It goes without saying that other forms of the plasma vessel 2 are also conceivable and encompassed by the invention.

The plasma source is fixed by a flange 11 in an opening in a vacuum chamber wall 10. In the exemplary embodiment in FIG. 1a, the extraction grid and also the wall 16 are electrically connected to the vacuum chamber wall 10 and are at ground potential.

The plasma source 1 has an RF electrode device 4, which is arranged partly outside the plasma vessel 2, with an electrode mount 7, which is connected to the side walls 16 of the plasma vessel 2 in a manner electrically insulated from the plasma vessel 2 by means of an insulator element 14 and compresses a plate-type element 5 held by holding elements 7a projecting into the interior of the plasma vessel 2. The electrode mount 7 has a bathtub-like form in cross section. On the rear side, the electrode device 4 is separated from the surroundings by a protective covering 13, wherein RF power can be applied or is applied to the RF electrode device 4 by means of an RF feed 13a, which can be connected or is connected to an RF generator. An RF matching network 13b is included as illustrated in FIG. 1a.

The front side of the plate-type element 5 is oriented toward the interior 20 of the vacuum chamber. The pot-like excitation electrode 6 is fitted to the front side of the plate-type element 5, said excitation electrode having an excitation area on its inner side 6a oriented toward the interior 20 of the vacuum chamber and the outer side 6d of said excitation electrode being at least partly in contact with the front side of the plate-type element 5. The excitation electrode 6 has a planar base and, fitted thereto, side walls 6c with end regions (end faces) 6b projecting into the plasma space 2. Excitation electrode 6 and element 5 are preferably bonded in order to ensure good thermal and electrical contact between the plate-type element 5 and the excitation electrode 6. The side walls 6c are formed by a wall of the excitation electrode 6.

The side walls 16 of the plasma vessel and the side walls 6c of the excitation electrode are arranged close to one another, and are separated from one another by a gap 21 dimensioned such that no plasma can form between the excitation electrode 6 and the side wall 16 during operation of the plasma source. Therefore, in the region of the gap 21, the side walls 16 of the plasma vessel 2 constitute a dark space shielding having a shielding area 16a of the excitation electrode 6.

The side walls 16 of the plasma vessel 2 project in the direction of the interior 20 of the vacuum chamber with a region beyond the side walls 6c, such that, during the operation of the plasma source 1, that region of the side walls 16 which projects beyond the end region 6b of the side walls 6c is in contact with the plasma and forms a plasma electrode having a plasma electrode area 16b.

During operation of the plasma source 1, the size of the DC self-bias between the excitation electrode 6 and the extraction electrode is determined by the size ratio of the excitation areas 6a and 6c to the area of the extraction electrode 3 and the size of the plasma electrode area 16b, that is to say of those parts of the side walls 16 of the plasma vessel 2 which are in contact with the plasma.

The magnet apparatus 8 having magnets 9a, 9b, 9c and also having a pole shoe 9d is arranged on the rear side of the excitation area 6a and of the plate-type element 5. The magnets 9a, 9b, 9c each comprise a magnetic north pole and a magnetic south pole, which are arranged with alternate polarity and are directed into the interior of the plasma space 2a, such that a curved magnetic field projecting into the interior of the plasma space is formed, as is known per se from DE 241 728 8 C2 or DE 243 183 2 B2, for example. The magnets 9a, 9b, 9c can be embodied as permanent magnets or as solenoids which are connected or can be connected to a power supply.

Figure 1B:
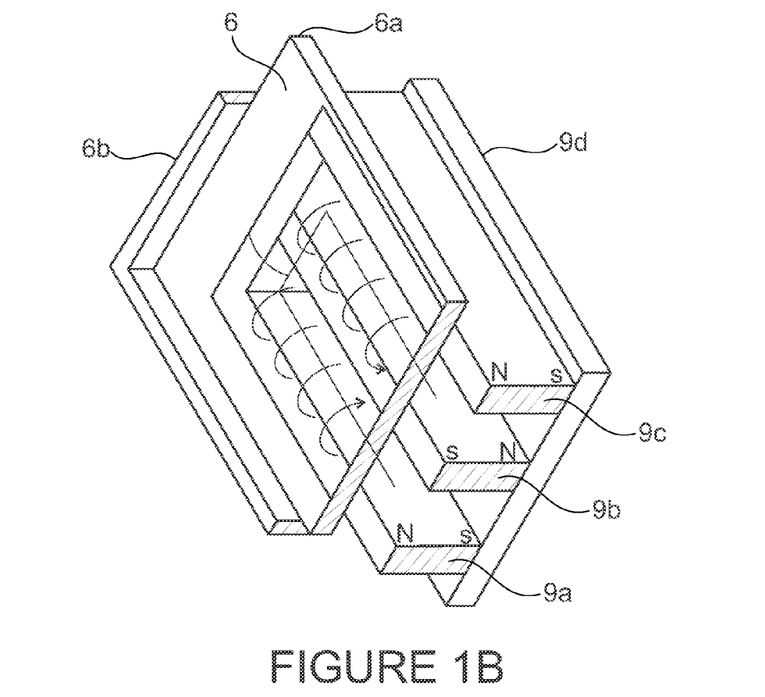
FIG. 1b shows a three-dimensional illustration of a magnet apparatus having a rectangular.

FIG. 1b illustrates one possible configuration of a magnet arrangement comprising rows of magnets 9a, 9b, 9c, wherein, on account of the respectively opposite polarity of the magnets, a tunnel-like region is formed between them. The magnets 9a and 9c in FIG. 1b are connected to one another in their end regions, such that a self-contained tunnel is formed.

Figure 1C:
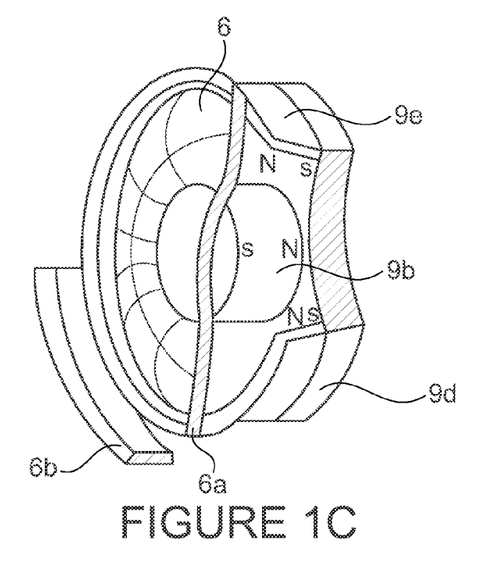

FIG. 1c illustrates a further configuration of a magnet apparatus, wherein a circular magnet 9e is arranged around a central magnet 9b, wherein a self-contained tunnel-like region is likewise formed.

Measurement results showing the advantages of the plasma source according to the invention are presented below. The operating pressure in the case of the measurements mentioned was $4 \times 10^{-3}$ mbar, and oxygen was supplied as reactive gas having an oxygen flow rate of 20 SCCM.

Figure 2:
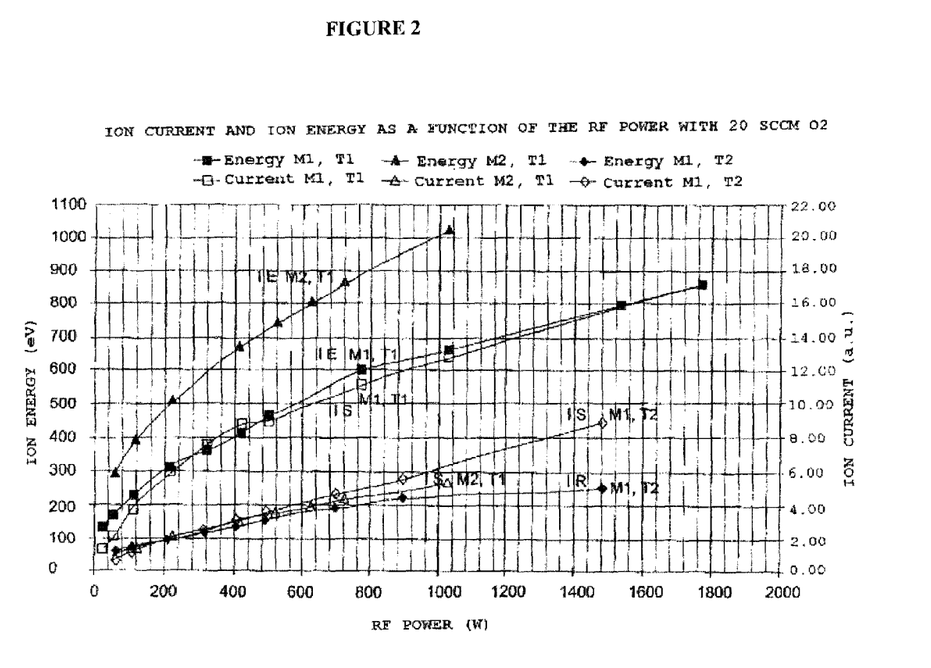
FIG. 2 shows a diagram of values of an ion current and of an ion energy as a function of the radiofrequency power of various embodiments of the plasma source according to the invention.

FIG. 2 shows a diagram of values of an ion current and of an ion energy for various embodiments of a plasma source according to the invention, wherein the curves designated by IS in each case represent the ion current (in arbitrary units) and the curves designated by IE represent the ion energy (in eV) as a function of the supplied radiofrequency power. The curves designated by the indices M1T1 were measured in the case of a plasma source with a circular magnetron magnetic field with a hollow electrode (hollow target), having a diameter of 200 mm and having a side height (lateral surface height) of 40 millimeters. The curves designated by the indices M2T1 were measured in the case of a plasma source with the same hollow electrode, but with a reduced magnetic field compared with the M1T1 case. The magnet arrangement was in this case moved away from the excitation electrode 6 by 25 millimeters relative to the position in the M1 case. It can be discerned that the ion energy is thus increased in the M2T1 case compared with the M1T1 case and that, at the same time, the ion current density is lower in the M2T1 case than in the M1T1 case.

The curves of the ion energies and ion currents for a plasma source with a flat target and the same magnet apparatus as in the M1T1 case are designated by M1T2. It can be discerned that both ion energy and ion current are reduced in the M1T2 case compared with the M1T1 case. Therefore, an increased ion current can be achieved by virtue of the embodiment of the excitation electrode as a hollow electrode. Furthermore, ion energy and ion current can be varied in a relatively simple manner by varying the position of the magnets relative to the excitation area.

Figure 3:
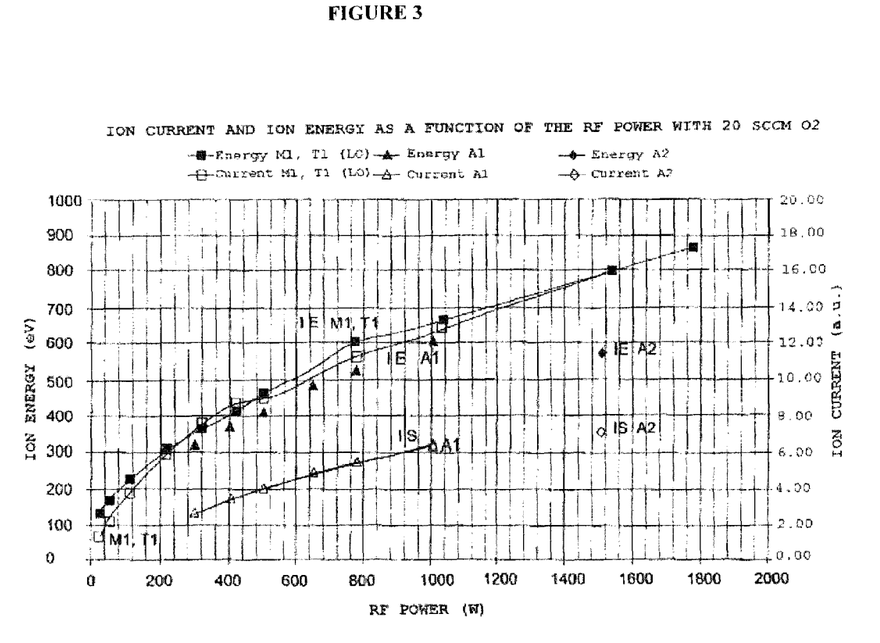
FIG. 3 shows a diagram of values of an ion current and of an ion energy as a function of the RF power of a plasma source according to the invention in comparison with plasma sources according to the prior art.

FIG. 3 shows a plotting of values of an ion energy and of an ion current as a function of the supplied radiofrequency power of the plasma source according to the invention in comparison with the corresponding values of two plasma sources from the prior art. Here the curves with the indices M1T1 designate a plasma source according to the invention, as in FIG. 2, while the curves designated by IEA1, ISA1 and IEA2, ISA2 designate values of a capacitively coupled and, respectively, an inductively/capacitively coupled plasma source having in each case the same diameter of the plasma space as the plasma source according to the invention. For the same supplied RF power, the plasma source according to the invention supplies a plasma beam having approximately the same high ion energy but an ion current twice as high as the capacitively excited source according to the prior art. For the same supplied RF power, the plasma source according to the invention supplies a plasma beam having an ion energy approximately 1.5 times as high and an ion current twice as high as the source having mixed inductive/capacitive excitation.

The invention claimed is:

1. A method for generating a neutral plasma beam that is extracted from a plasma generated in response to electric and magnetic fields, the method comprising:

applying a radiofrequency voltage to an extraction electrode to generate electric and magnetic fields and extracting the plasma beam from the plasma generated by the electric and magnetic fields, the extraction electrode formed as a grid having a plurality of openings such that the plasma beam passes therethrough;

disposing an RF electrode device including an excitation electrode having an excitation area;

arranging a plasma space between the extraction electrode and the excitation area such that over time the plasma is at a higher electrical potential with respect to the extraction electrode to accelerate positive plasma ions, the plasma and the extracted plasma beam are influenced by a magnetic field;

arranging a planar magnetron on a side facing away from the plasma and behind the excitation electrode such that the excitation electrode surrounds the magnetron;

directing a magnetic north pole and a magnetic south pole of said planar magnetron into the interior of the plasma space; and generating the magnetic field via the planar magnetron such that a curved magnetic field projecting into the interior of the plasma space is formed, the curved magnetic field influencing the plasma and the extracted plasma beam.

2. A plasma source to carry out the method as claimed in claim 1, the plasma source comprising:

a plasma vessel;

the extraction electrode formed as a grid having a plurality of openings;

the RF electrode device including the excitation electrode having the RF excitation area, the RF electrode device in electrical communication with an RF generator via a matching network;

a plasma space including a plasma excitation area that excites plasma, the plasma space situated between the plasma excitation area and the extraction electrode, wherein a size of the RF excitation area and a size of the plasma excitation area are chosen in such that a bulk of the radiofrequency voltage is reduced across the extraction electrode; and a magnet apparatus configured to generate a magnetic field, the magnet apparatus surrounded by the excitation electrode, wherein the magnet apparatus is embodied as a planar magnetron having at least one magnetic north pole and one magnetic south pole, each of the magnetic north pole and the magnetic south pole arranged on a side facing away from the plasma space behind the excitation electrode, and each of the magnetic north pole and the magnetic south pole are directed into an interior of the plasma space, such that a curved magnetic field projecting into the interior of the plasma space is formed, and a tunnel region is formed such that charged particles are held, the charged particles propogatable along the tunnel region.

3. The plasma source as claimed in claim 2, wherein the excitation area is embodied in concave fashion with respect to the plasma space at least in partial regions.

4. The plasma source as claimed in claim 2, wherein the excitation area is embodied in convex fashion with respect to the plasma space at least in partial regions.

5. The plasma source as claimed in claim 2, wherein at least one part of the excitation area is embodied in planar fashion.

6. The plasma source as claimed in claim 2, wherein at least one part of the extraction electrode is embodied according to one shape from the group of shapes comprising a planar shape, a concave shape, and a convex shape.

7. The plasma source as claimed in claim 2, wherein the magnet apparatus is embodied as a circular or rectangular magnetron, preferably equipped with a hollow electrode.

8. The plasma source as claimed in claim 2, wherein the excitation electrode is embodied in pot-like fashion, with a base region and side walls, and projects into the plasma space at least with the side walls.

9. The plasma source as claimed in claim 2, wherein a dark space shielding assigned to the excitation electrode and having a shielding area is provided.

10. The plasma source as claimed in claim 9, wherein a size of the area of the extraction electrode and a size of a plasma electrode area in contact with the plasma, on the one hand are chosen in such a way that the plasma, relative to the extraction electrode, on average over time, acquires a higher potential that accelerates positive plasma ions.

11. The plasma source as claimed in claim 10, wherein the excitation area has a size such that the plasma, relative to the extraction electrode, on average over time, acquires a higher potential that accelerates positive plasma ions.

12. The plasma source as claimed in claim 9, wherein at least one part of walls of the plasma vessel is formed by parts of the dark space shielding and/or parts of the excitation electrode.

13. The plasma source as claimed in claim 2, wherein partial regions of the excitation area are arranged on an inner side of a wall of the excitation electrode or form the latter, and an outer side of the wall is surrounded by a shielding area of the dark space shielding at least in partial regions.

14. The plasma source as claimed in claim 2, wherein an altering device configured to the magnetic field is provided.

15. The plasma source as claimed in claim 14, wherein the altering device is configured to alter the position of at least one of the magnetic north or south poles relative to the excitation area.

16. The plasma source as claimed in claim 14, wherein the altering device is configured to alter the magnetic field strength of at least one of the magnetic north or south poles.

* * * * *